(12) United States Patent
Borthakur et al.

(10) Patent No.: US 8,617,975 B2
(45) Date of Patent: *Dec. 31, 2013

(54) SEMICONDUCTOR PROCESSING METHODS

(75) Inventors: Swarnal Borthakur, Boise, ID (US);
Richard L. Stocks, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/494,151

(22) Filed: Jun. 12, 2012

(65) Prior Publication Data
US 2012/0252153 A1 Oct. 4, 2012

Related U.S. Application Data

(63) Continuation of application No. 11/774,761, filed on Jul. 9, 2007, now abandoned, and a continuation of application No. 12/959,678, filed on Dec. 3, 2010, now Pat. No. 8,211,787.

(51) Int. Cl.
*H01L 21/768* (2006.01)

(52) U.S. Cl.
USPC ............... 438/597; 438/64; 438/66; 438/639; 438/667; 438/696; 257/E21.577; 257/E21.495; 257/E31.127

(58) Field of Classification Search
USPC ..................................................... 438/64–66
See application file for complete search history.

(56) References Cited

U.S. PATENT DOCUMENTS

| | | | |
|---|---|---|---|
| 5,235,463 A | 8/1993 | Broussoux et al. |
| 5,940,732 A | 8/1999 | Zhang |
| 6,261,921 B1 | 7/2001 | Yen et al. |
| 6,555,476 B1 | 4/2003 | Olsen et al. |
| 6,759,340 B2 | 7/2004 | Nallan |
| 6,846,746 B2 | 1/2005 | Rattner et al. |

(Continued)

FOREIGN PATENT DOCUMENTS

| KR | 10-2005-0012659 | 2/2005 |
|---|---|---|
| KR | 01-2007-0030394 | 3/2007 |

(Continued)

OTHER PUBLICATIONS

Donohue, L.A., et al. "Addressing sidewall roughness using dry etching silicon and SIO2" Solid State Technology, Jul. 2004, pp. 2-4.

(Continued)

*Primary Examiner* — Angel Roman
(74) *Attorney, Agent, or Firm* — Wells St. John P.S.

(57) ABSTRACT

Some embodiments include methods of forming semiconductor constructions in which a semiconductor material sidewall is along an opening, a protective organic material is over at least one semiconductor material surface, and the semiconductor material sidewall and protective organic material are both exposed to an etch utilizing at least one fluorine-containing composition. The etch is selective for the semiconductor material relative to the organic material, and reduces sharpness of at least one projection along the semiconductor material sidewall. In some embodiments, the opening is a through wafer opening, and subsequent processing forms one or more materials within such through wafer opening to form a through wafer interconnect. In some embodiments, the opening extends to a sensor array, and the protective organic material is comprised by a microlens system over the sensor array. Subsequent processing may form a macrolens structure across the opening.

20 Claims, 9 Drawing Sheets

(56) References Cited

U.S. PATENT DOCUMENTS

| | | | |
|---|---|---|---|
| 6,924,235 | B2 | 8/2005 | Johnson et al. |
| 717,339 | A1 | 2/2007 | Ko et al. |
| 7,173,339 | B1 | 2/2007 | Ko et al. |
| 7,563,379 | B2 | 7/2009 | Suzuki et al. |
| 8,211,787 | B2 * | 7/2012 | Borthakur et al. ............ 438/597 |
| 2004/0092105 | A1 | 5/2004 | Lee et al. |
| 2004/0188819 | A1 | 9/2004 | Farnworth et al. |
| 2005/0196957 | A1 | 9/2005 | Kameyama |
| 2005/0205898 | A1 | 9/2005 | Van Arendonk et al. |
| 2005/0208766 | A1 * | 9/2005 | Kirby et al. ................... 438/667 |
| 2006/0087042 | A1 | 4/2006 | Kameyama |
| 2006/0105275 | A1 * | 5/2006 | Maloney et al. .............. 430/320 |
| 2006/0205238 | A1 | 9/2006 | Chinn et al. |
| 2006/0290001 | A1 | 12/2006 | Sulfridge |
| 2006/0292877 | A1 | 12/2006 | Lake |
| 2007/0152251 | A1 | 7/2007 | Park |
| 2007/0281474 | A1 | 12/2007 | Suzuki et al. |

FOREIGN PATENT DOCUMENTS

| | | |
|---|---|---|
| KR | 10-2007-0030394 | 3/2007 |
| WO | WO 2005/026042 | 3/2005 |
| WO | WO 2005026042 | 3/2005 |
| WO | WO 2008/065803 | 11/2008 |

OTHER PUBLICATIONS

Johnson, Vaughn N., et al. "Through Wafer Interconnects in Active pMOS Devices" IEEE, 2004, pp. 82-84.

Liang Yan, Frabrication of Pentacene Thin Film Transistors with Patterned Ployimide Photoresist as Gate Dielectrics and Research of their Degradation, Jun. 25, 2004, pp. 2278-2280.

Zhou, Rongchun, et al. "Simulation of the Bosch process with a string-cell hybrid method" May 13, 2004 IOP Publishing Ltd.

PCT/US2008/065803, Jan. 12, 2010, Micron Technology, Inc.

\* cited by examiner

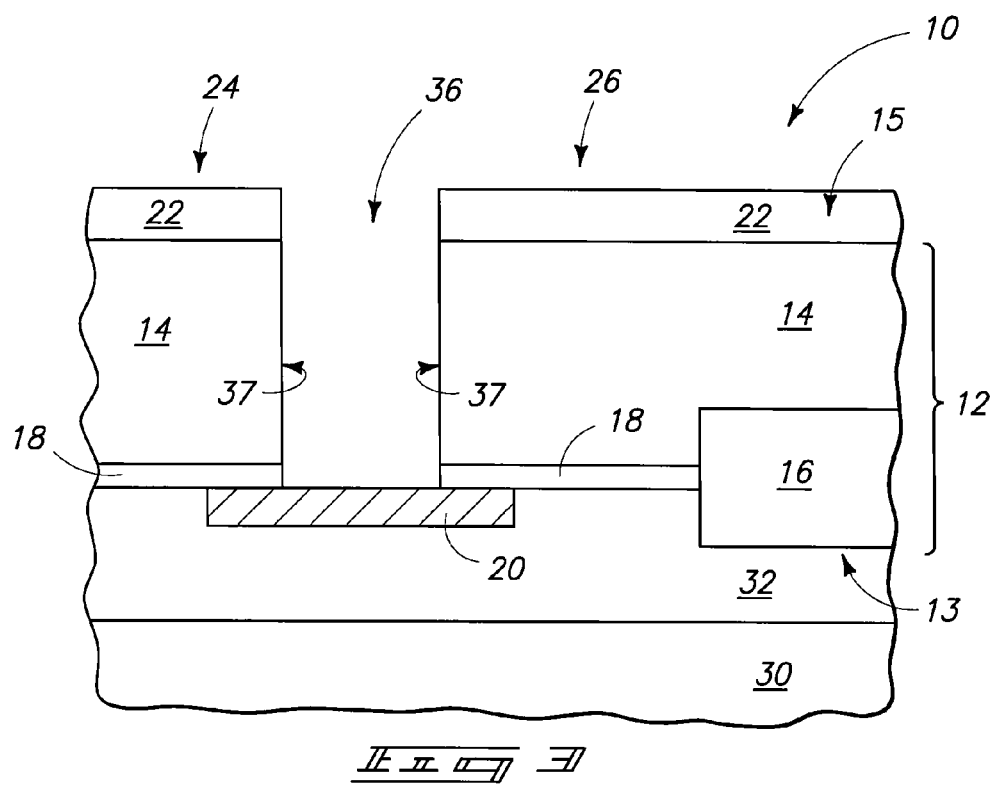
_FIG. 3_
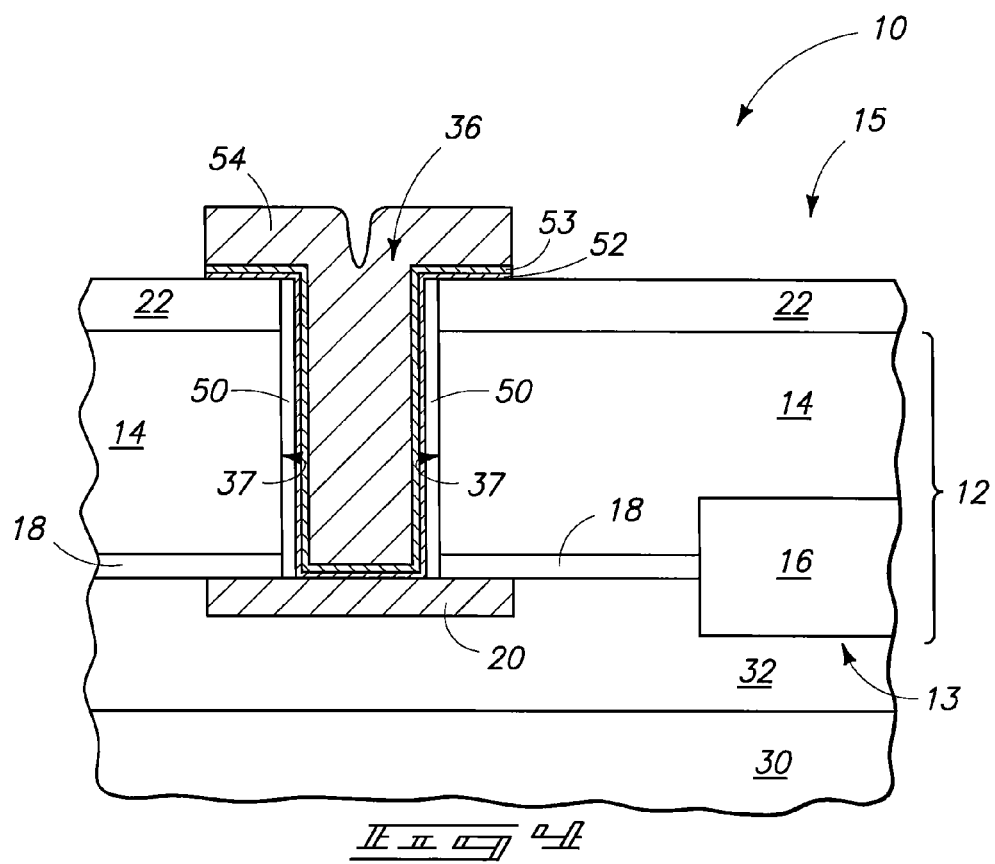
_FIG. 4_

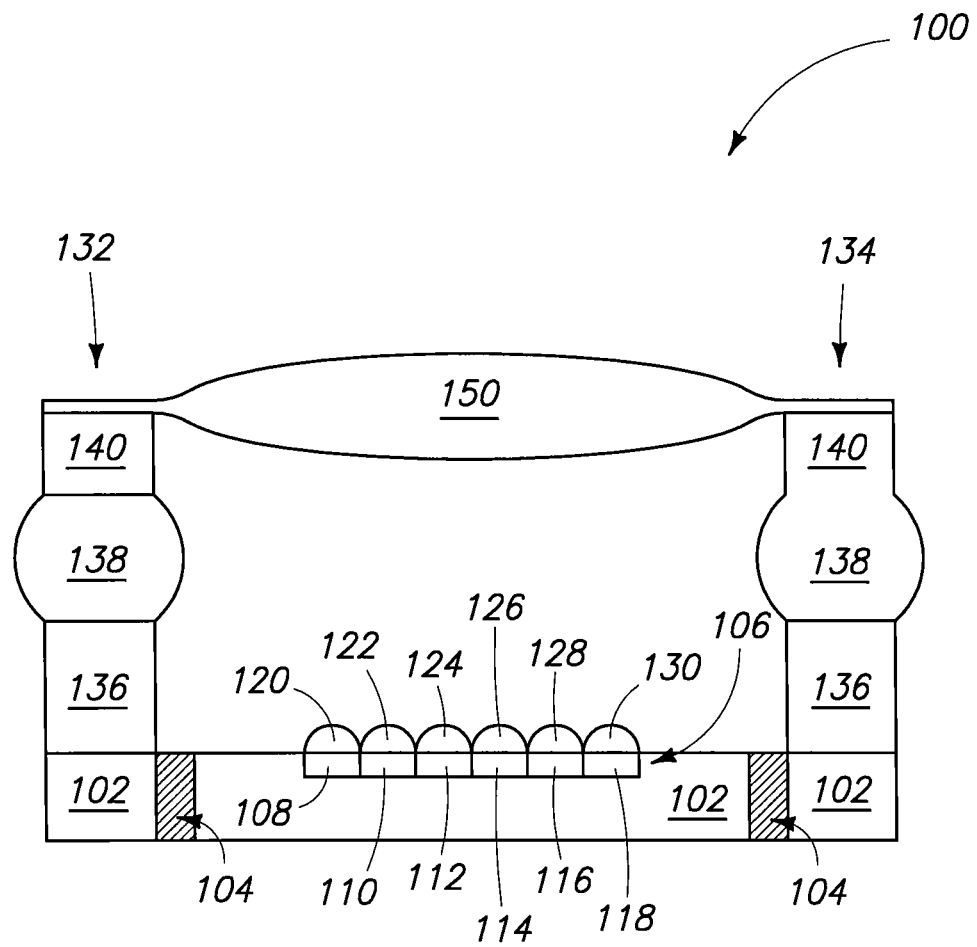

US 8,617,975 B2

SEMICONDUCTOR PROCESSING METHODS

RELATED PATENT DATA

This application is a continuation of U.S. patent application Ser. No. 12/959,678 that was filed on Dec. 3, 2010, which is a continuation of U.S. patent application Ser. No. 11/774,761, which was filed on Jul. 9, 2007 and which is incorporated herein by reference.

TECHNICAL FIELD

Semiconductor processing methods.

BACKGROUND

Fabrication of integrated circuitry often involves formation of openings within semiconductor material, followed by deposition of one or more materials within the openings.

A problem that can occur during formation of an opening within semiconductor material is that the sidewall peripheries of the opening may comprise a jagged topography. The jagged topography may result from, for example, scalloping of the sidewall peripheries during the etch utilized to form the opening. For instance, a high etch rate of Si may be utilized to increase throughput, and such high etch rate may cause an increased scallop size relative to lower etch rates.

The jagged topography may cause cracking or other defects in materials formed within the opening and along the jagged topography. For instance, scallops are stress concentration points, and may cause failures (cracks and shorts) during subsequent processing, as well as during solder reflow and reliability tests pertaining to some structures. It is therefore desired to develop methods which alleviate jagged topography.

Semiconductor materials may have numerous applications in construction of various integrated circuit structures. In some applications, a semiconductor material may be in the form of the wafer that supports the integrated circuitry. In such applications, openings may be formed to extend into the wafer for fabrication of circuitry, and/or to extend through the wafer for fabrication of through wafer interconnects (TWIs).

In some applications, semiconductor material may be utilized to form pedestals (or spacers) which support an upper structure over a lower structure. For instance, the semiconductor material pedestals may support a macrolens system over an electromagnetic radiation sensor. In some applications, a microlens system may be over the electromagnetic radiation sensor, and the macrolens may be formed to be over the microlens system.

A problem that may occur in forming semiconductor pedestals is that the pedestals may have undesired sharp corners. Accordingly, it would be desired to develop methods of alleviating such sharp corners.

BRIEF DESCRIPTION OF THE DRAWINGS

FIG. 3 is a view of the portion of FIG. 1 shown at a processing stage subsequent to that of FIG. 2.

FIG. 4 is a view of the portion of FIG. 1 shown at a processing stage subsequent to that of FIG. 3.

FIG. 17 is a view of the portion of FIG. 15 shown at a processing stage subsequent to that of FIG. 16.

DETAILED DESCRIPTION OF THE ILLUSTRATED EMBODIMENTS

In some embodiments, semiconductor material is subjected to an etch which reduces sharpness of features across a topography. Such reduction in sharpness may alleviate one or more of the problems discussed above in the "Background" section of this disclosure. In some embodiments, the reduction in sharpness of structures (for instance, reduction of scalloping) is achieved while maintaining high throughput. Example embodiments are described with reference to FIGS. 1-17.

Figure 1:
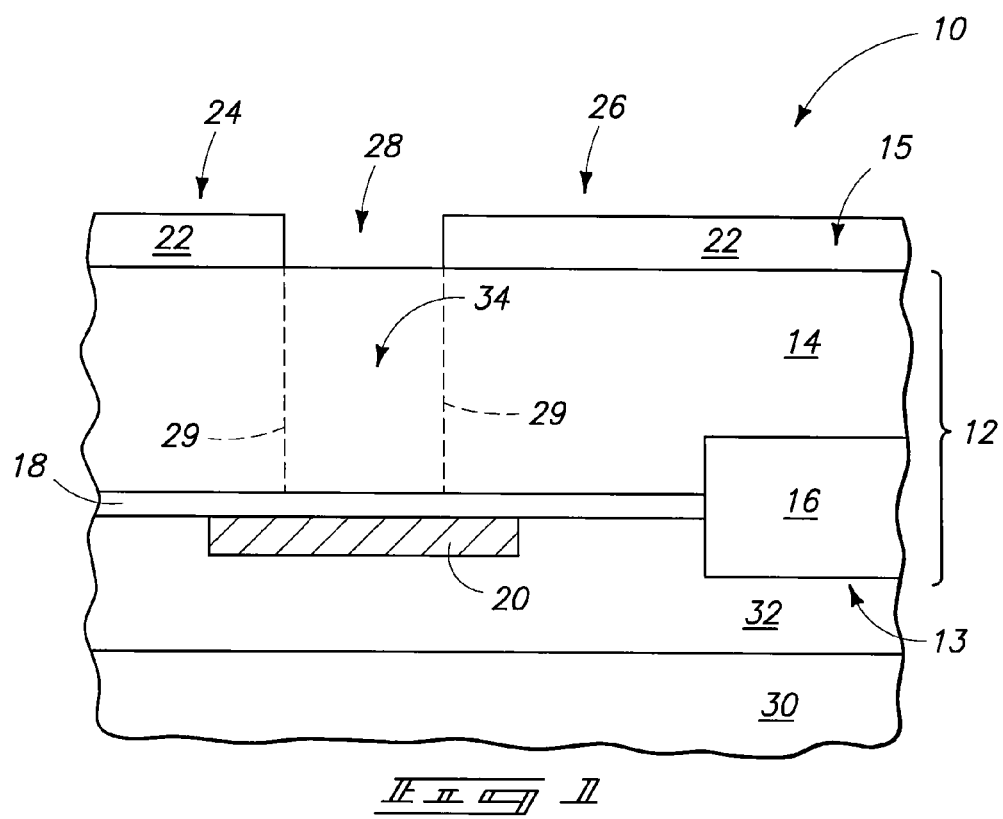
FIG. 1 is a diagrammatic, cross-sectional view of a portion of a semiconductor construction at a processing stage of an embodiment.

Referring to FIG. 1, such illustrates a portion of a semiconductor construction 10. The construction includes a semiconductor substrate 12 having a base 14.

The base may comprise any of various semiconductor materials, such as, for example, silicon. The semiconductor material may be in any suitable form, and in some embodiments at least some of the semiconductor material may be in monocrystalline form. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

Although semiconductor substrate base 14 is shown to be homogenous, the base may comprise numerous layers in some embodiments. For instance, the base 14 may contain one or more layers associated with integrated circuit fabrication. In such embodiments, such layers may correspond to one or more of metal interconnect layers, barrier layers, diffusion layers, insulator layers, etc.

The semiconductor substrate 12 comprises a front side 13 and a back side 15. Some structures are diagrammatically illustrated as being associated with the front side. Specifically, a sensor array 16, a dielectric material 18 and a conductive layer 20 are shown. The sensor array may be a CMOS array configured for detecting electromagnetic radiation. The dielectric material may be any suitable composition or combination of compositions, and may, for example, comprise, consist essentially of, or consist of silicon dioxide. The conductive layer may comprise any suitable composition or combination of compositions, and may, for example, comprise, consist essentially of, or consist of aluminum.

A patterned masking material 22 is over the back side 15 of base 14. The patterned masking material may comprise a polymeric organic material. Such organic material may be a composite comprising inorganic constituents. In some embodiments, the organic material may be a photoresist. In some embodiments, the patterned masking material may be considered to correspond to a protective organic material that is over a surface of the back side 15.

The patterned masking material 22 is in the form of a pair of segments 24 and 26 having a gap 28 between them. The gap 28 is directly over a location 34 for a through-wafer connection. The through-wafer connection location 34 is diagrammatically illustrated as a location between dashed lines 29.

The conductive layer 20 is across a segment of the dielectric material 18, and both the dielectric material 18 and the conductive layer 20 have portions extending across the through-wafer connection location. The sensor array 16 is illustrated to be laterally offset from the portions of dielectric material 18 and conductive layer 20 that extend across the through-wafer connection location.

The semiconductor substrate 12 may be difficult for automated equipment to grasp and transfer. Accordingly, substrate 12 is shown bonded to a carrier wafer 30 through adhesive 32. The carrier wafer and adhesive may comprise conventional configurations and compositions. The carrier wafer may be utilized as a handle which can be grasped and manipulated by automated equipment during treatment of substrate 12.

Figure 2:
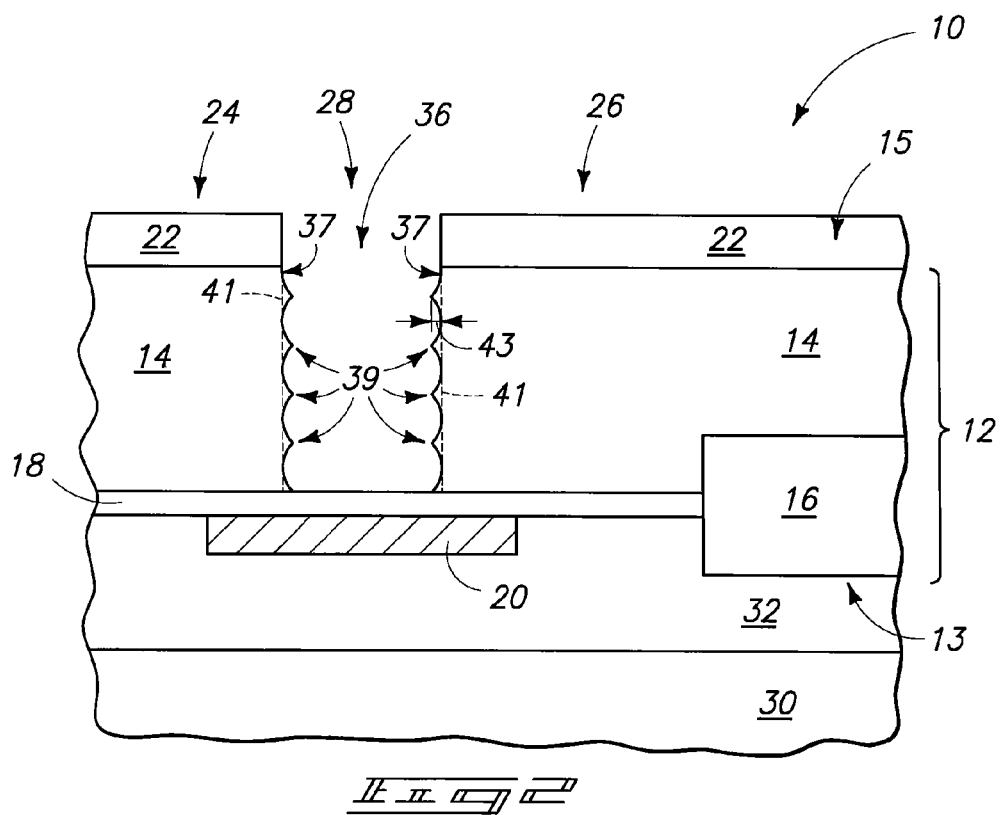
FIG. 2 is a view of the portion of FIG. 1 shown at a processing stage subsequent to that of FIG. 1.

Referring to FIG. 2, an etch is conducted to extend gap 28 into base 14, and thus form an opening 36 extending through base 14 to dielectric material 18. If base 14 comprises a monocrystalline silicon wafer, the etch through such wafer may be a Bosch-type etch utilizing $SF_6$ and $C_4F_8$ gases.

The etch forms jagged sidewall surfaces 37 along the sidewall periphery of opening 36. The jagged sidewall surfaces are shown to comprise scalloping, with such scalloping forming substantially pointed features 39 along the sidewall periphery. The features are referred to as being "substantially pointed" to differentiate the form of the features from a less pointed (or dulled) form that results from a subsequent etch discussed below with reference to FIG. 3. The jagged sidewall surfaces may comprise, consist essentially of or consist of monocrystalline silicon in some embodiments.

The opening 36 is a through-wafer opening formed in the through-wafer connection location 34 (FIG. 1). The through-wafer opening may have a depth from an upper surface of back side 15 to an upper surface of dielectric 18 of about 100 microns.

Referring to FIG. 3, an etch is conducted to extend opening 36 through dielectric material 18. The etch simultaneously reduces the jaggedness of sidewalls of 37. The etch is selective for materials 14 and 18 relative to material 22. An etch is selective for a first material relative to a second material if the etch removes the first material at a faster rate than it removes the second material, which may include, but is not limited to, an etch which is 100 percent selective for the first material relative to the second material.

In embodiments in which material 22 is an organic material, (such as photoresist), material 14 consists of monocrystalline silicon or doped monocrystalline silicon, and material 18 consists of silicon dioxide, the etch may utilize, for example, one or more fluorine-containing compositions, and may, for example, utilize one or more of $CF_4$, $CHF_3$ and $NF_3$. The etch may be conducted in reaction chamber utilizing a chuck temperature of about 10° C., a back side pressure against the construction 10 of about 9 torr, a chamber pressure of about 200 millitorr, and a substrate bias of about 1050 watts. The treatment may be conducted for time of about 220 seconds. In an example embodiment, the etch utilizes the described temperature, pressure and bias conditions, and utilizes all of $CF_4$, $CHF_3$ and $NF_3$. The $CF_4$ is flowed into the chamber at a rate of about 70 standard cubic centimeters per minute (sccm), the $CHF_3$ is flowed into the chamber at a rate of about 20 sccm, and the $NF_3$ is flowed into the chamber at a rate of about 20 sccm. Additionally, argon may be flowed into the chamber at a rate of about 50 sccm.

The etch may have a selectivity for the silicon dioxide 18 relative to the organic material 22 of at least about 10:1; and may have a selectivity for semiconductor material 14 relative to the organic material 22 of at least about 5:1. Part of the reason that the etch has greater selectivity for material 18 than material 14 may be that the bias on the substrate makes the etch primarily anisotropic.

The reduction in the jaggedness of sidewalls 37 may eliminate, or at least substantially eliminate, projections 39 from the sidewalls (as shown). In some embodiments, the reduction in the jaggedness may be considered to be a decrease in the height of the projections as measured relative to the sidewall surface from which the projections extend. Specifically, dashed lines 41 are provided in FIG. 2 to illustrate approximate locations of the primary sidewalls (with such approximate locations corresponding to extensions along the edges of segments 24 and 26 of the organic material 22). A "height" of one of the projections is labeled with an axis 43 measuring the distance that the projection extends from the approximate location of the primary sidewall 41. The reduction in jaggedness of sidewall 37 accomplished by the processing of FIG. 3 may correspond to a reduction of the height of the projection of at least a factor of two. The reduction in height, without a corresponding change in width, causes an increase in the width-at-half-height of the projections, which is another way of expressing a reduction in sharpness of the projections. In some embodiments, the width-at-half-height of at least one of the projections increases by at least about 30 percent.

The opening 36 of FIG. 3 may be considered a through-wafer opening that extends from an upper surface of back side 15 to the conductive material 20 along the front side. The opening may have any suitable shape, and may, for example, appear circular or elliptical when viewed from above.

Referring to FIG. 4, various materials are formed within opening 36 to create a through-wafer interconnect. Specifically, an electrically insulative spacer 50 is formed in the opening, followed by a copper barrier material 52, a seed material 53, and finally by a conductive material 54. The organic material 22 may be hard cured, and may be utilized as passivation between conductive material 52 and silicon 14.

Spacer 50 may comprise any suitable composition or combination of compositions, and may, for example, comprise, consist essentially of or consist of silicon dioxide and/or other low-k dielectric material (with low-k dielectric material being material that has a dielectric constant less than or equal to that of silicon dioxide). The spacer may be formed by depositing spacer material across a surface of back side 15 and within opening 36, and then subjecting the material to an anisotropic etch to leave the shown spacer 50 which narrows the opening.

The barrier material 52 may comprise, consist essentially of, or consist of any suitable composition or combination of compositions, and may, for example, comprise one or more of Ta, TaN, Ti and W. The barrier material 52 may alleviate or prevent copper diffusion into the sidewall passivation and subsequent shorting to silicon.

The seed material 53 comprises a composition, (such as, for example, copper), that copper may subsequently be electroplated onto.

Materials 52 and 53 may be deposited by physical vapor deposition (PVD).

Conductive material 54 may comprise any suitable composition or combination of compositions, and may, for example, comprise, consist essentially of, or consist of one or more of copper, nickel and palladium. Material 54 may be electrolytically formed over the seed material, or may be formed by electroless deposition. A protective layer of patterned photoresist may be formed over material 53 prior to electroplating of material 54 to protect regions of construction 10 where material 54 is not desired while leaving other regions exposed for plating of material 54. The resist can then be stripped with isopropyl alcohol and acetone, and then exposed portions of materials 52 and 53 may be removed with suitable etching. For instance, a copper-containing seed material 53 may be removed utilizing $H_2O_2/HCl$, and a Ta-containing barrier can be removed with a dry etch utilizing Cl and Ar (if the barrier comprises W, such may be removed with a wet etch instead of with a dry etch). Although material 54 is shown filling the via, in other embodiments that material may not completely fill the via. It can be desired that material 54 not completely fill the via in order to avoid stresses that may otherwise occur. Material 54 may, for example, be formed to a thickness of about 2 microns in a via having a diameter of about 40 microns.

The reduction in the jaggedness of sidewalls 37 prior to formation of materials 50, 52, 53 and 54 within opening 36 may alleviate, or even prevent, cracking or other defects that may otherwise occur within one or more of materials 50, 52, 53 and 54 if the sharp projections 39 (FIG. 2) remain during the formation of materials 50, 52, 53 and 54 within the opening. The reduction in jaggedness of the sidewalls may also alleviate or prevent problems that may otherwise occur during solder reflow and/or reliability testing.

The processing of FIGS. 1-4 is one method in which an etch may be utilized to reduce jaggedness of the sidewalls of an opening prior to formation of electrically conductive interconnect materials within the opening. Another embodiment is discussed with reference to FIGS. 5-9. Similar numbering will be utilized for describing FIGS. 5-9 as is utilized above for describing FIGS. 1-4, where appropriate.

Figure 5:
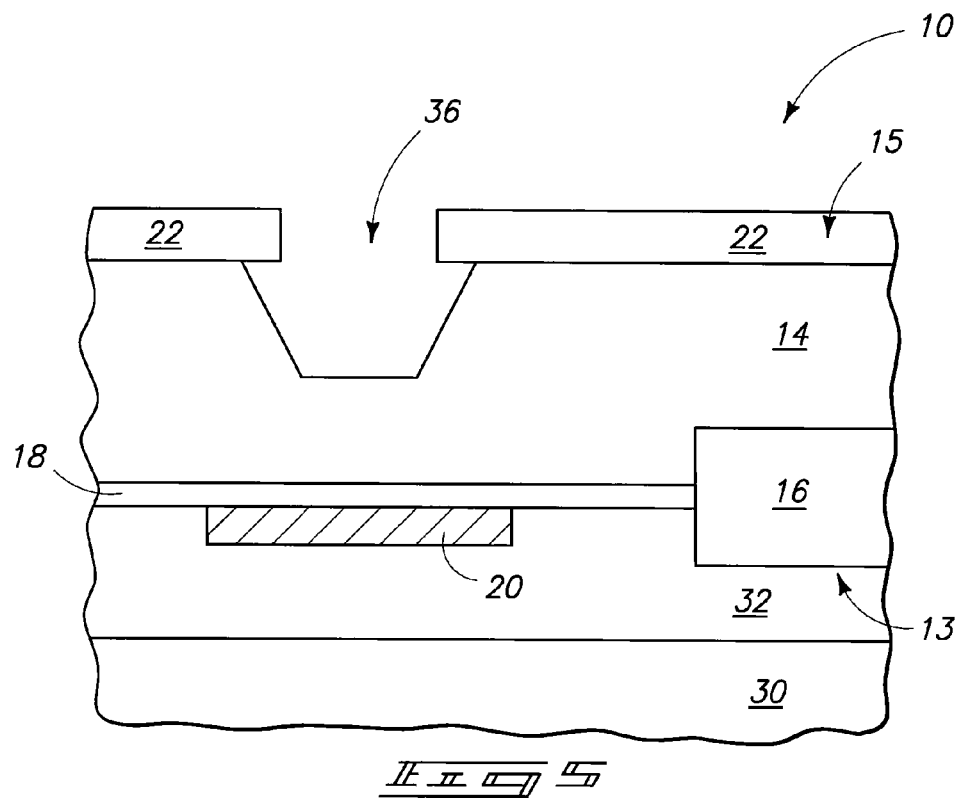
FIG. 5 is a diagrammatic, cross-sectional view of a portion of a semiconductor construction at a processing stage of another embodiment.

Referring to FIG. 5, construction 10 is illustrated at a processing stage subsequent to that of FIG. 1, after a wet etch to form opening 36 extending partially into base 14.

Figure 6:
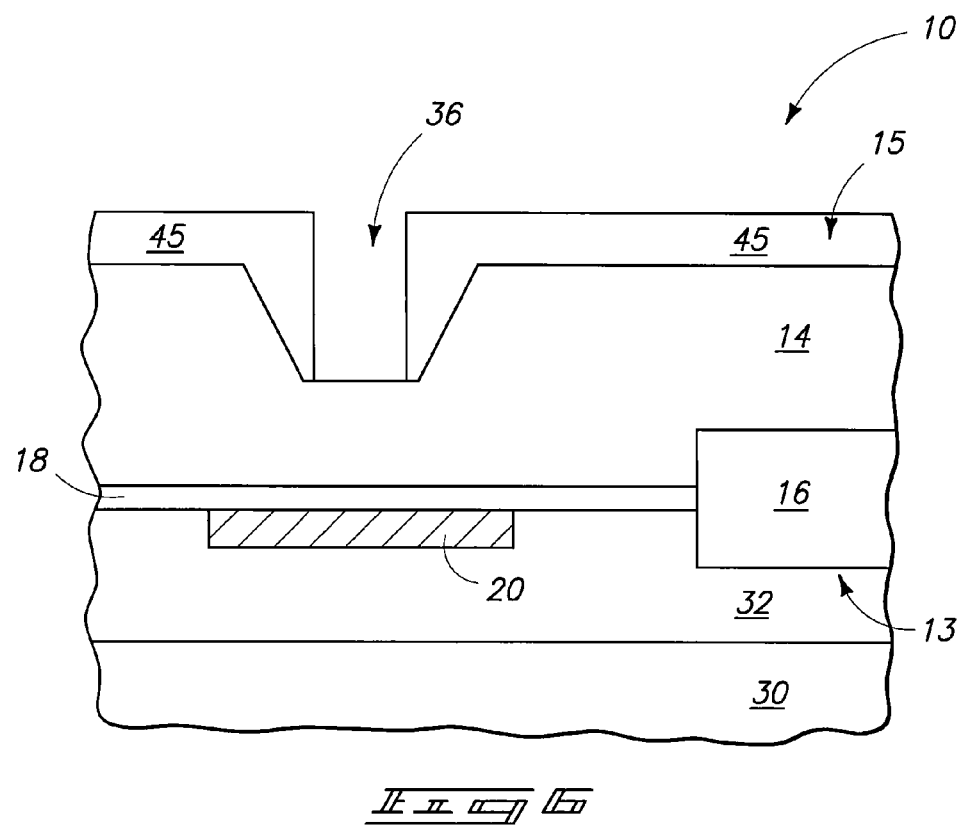
FIG. 6 is a view of the portion of FIG. 5 shown at a processing stage subsequent to that of FIG. 5.

Referring to FIG. 6, masking material 22 (FIG. 5) is removed and replaced with another patterned masking material 45. Material 45 may comprise, for example, photolithographically-patterned photoresist.

Figure 7:
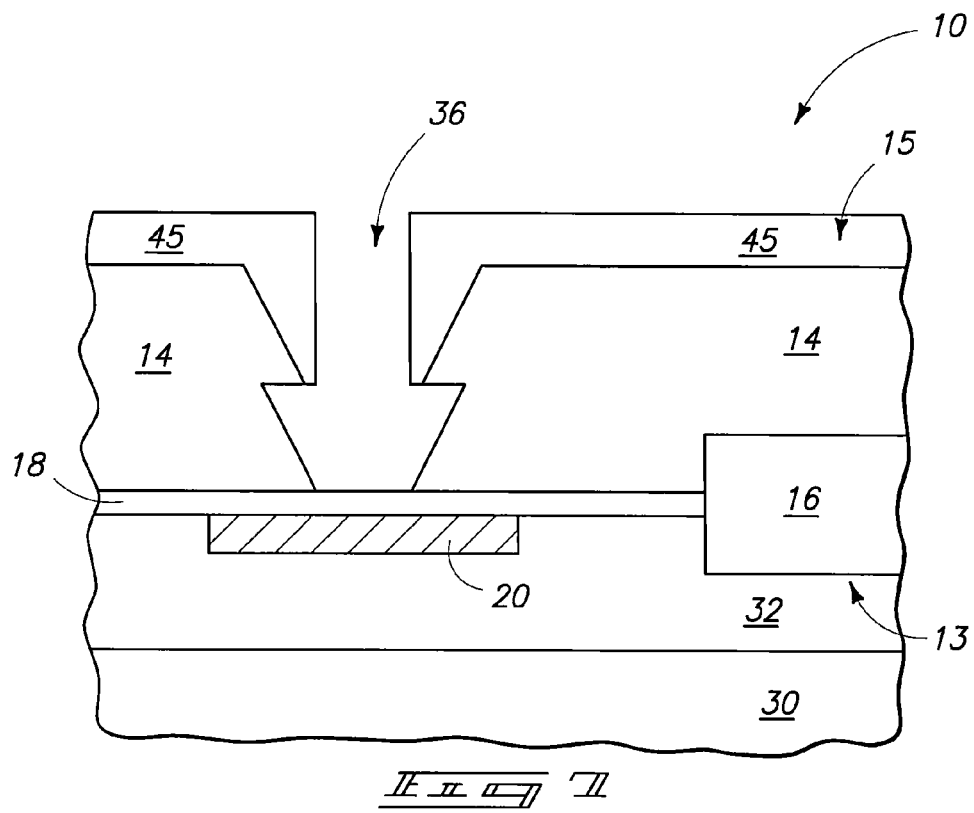
FIG. 7 is a view of the portion of FIG. 5 shown at a processing stage subsequent to that of FIG. 6.

Referring to FIG. 7, another wet etch is conducted to extend opening 36 to dielectric material 18.

Figure 8:
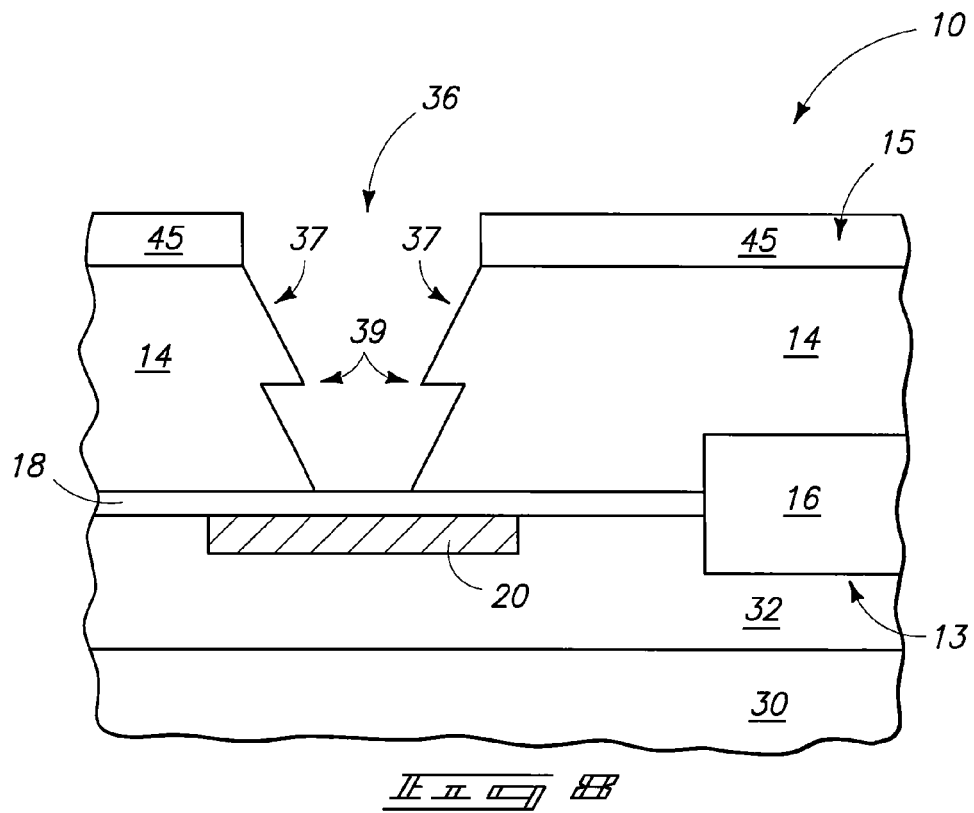
FIG. 8 is a view of the portion of FIG. 5 shown at a processing stage subsequent to that of FIG. 7.

Referring to FIG. 8, masking material 45 is laterally recessed to remove the masking material from within opening 36. Alternatively, masking material 45 could be removed and replaced with another masking material that is patterned to be over base 14 and outside of opening 36.

The opening 36 of FIG. 8 has a sidewall periphery 37 containing a plurality of pointed projections 39.

Figure 9:
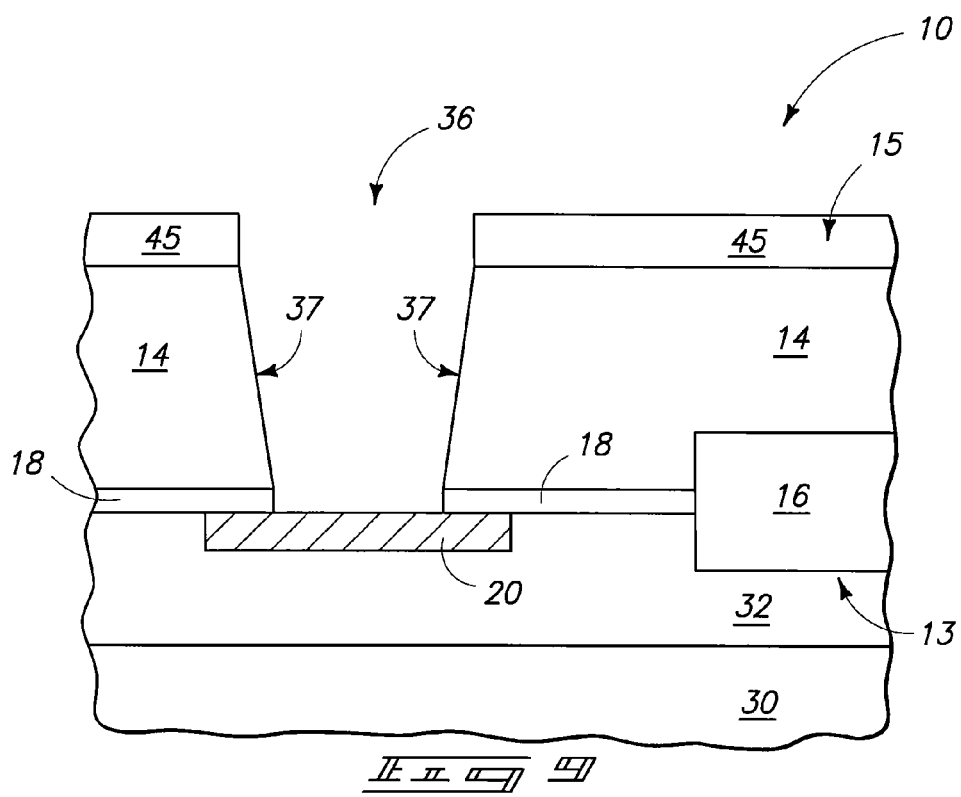
FIG. 9 is a view of the portion of FIG. 5 shown at a processing stage subsequent to that of FIG. 8.

Referring to FIG. 9, construction 10 is subjected to an etch of the type discussed above with reference to FIG. 3. Such etch punches through dielectric 18 while simultaneously reducing the sharpness of projections 39 (FIG. 8). In the shown embodiment, the etch has eliminated the projections and transformed the sidewalls 37 of FIG. 8 into straight sidewalls. The shown sidewalls extend at an angle less than 90° from an upper surface of layer 20.

Additional processing may be conducted relative to the construction of FIG. 9 to form a through-wafer interconnect of the type shown in FIG. 4.

Another embodiment of forming a through wafer interconnect is discussed with reference to FIGS. 10 and 11. Similar numbering will be utilized for describing FIGS. 10 and 11 as is utilized above for describing FIGS. 1-4, where appropriate.

Figure 10:
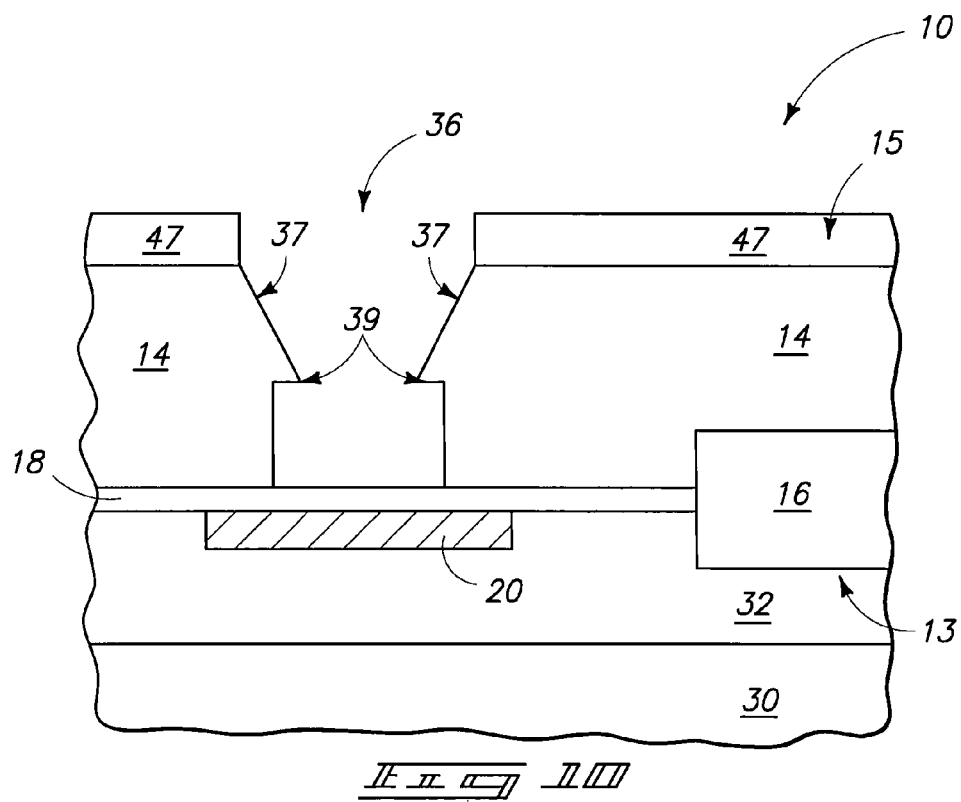
FIG. 10 is a diagrammatic, cross-sectional view of a portion of a semiconductor construction at a processing stage of another embodiment.

Referring to FIG. 10, construction 10 is illustrated at a processing stage subsequent to that of FIG. 1. A patterned masking material 47 is over base 14. Material 47 may comprise, for example, photolithographically-patterned photoresist. A wet etch has been conducted to form opening 36 extending partially into base 14, and a dry etch has been conducted to extend the opening the remainder of the way to the base. The wet etch forms an upper region of the opening, the dry etch forms a lower region of the opening, and the upper and lower regions join to one another at an interface comprising projections 39. Scalloping (not shown) may be within the portion of the opening formed by the dry etch.

Figure 11:
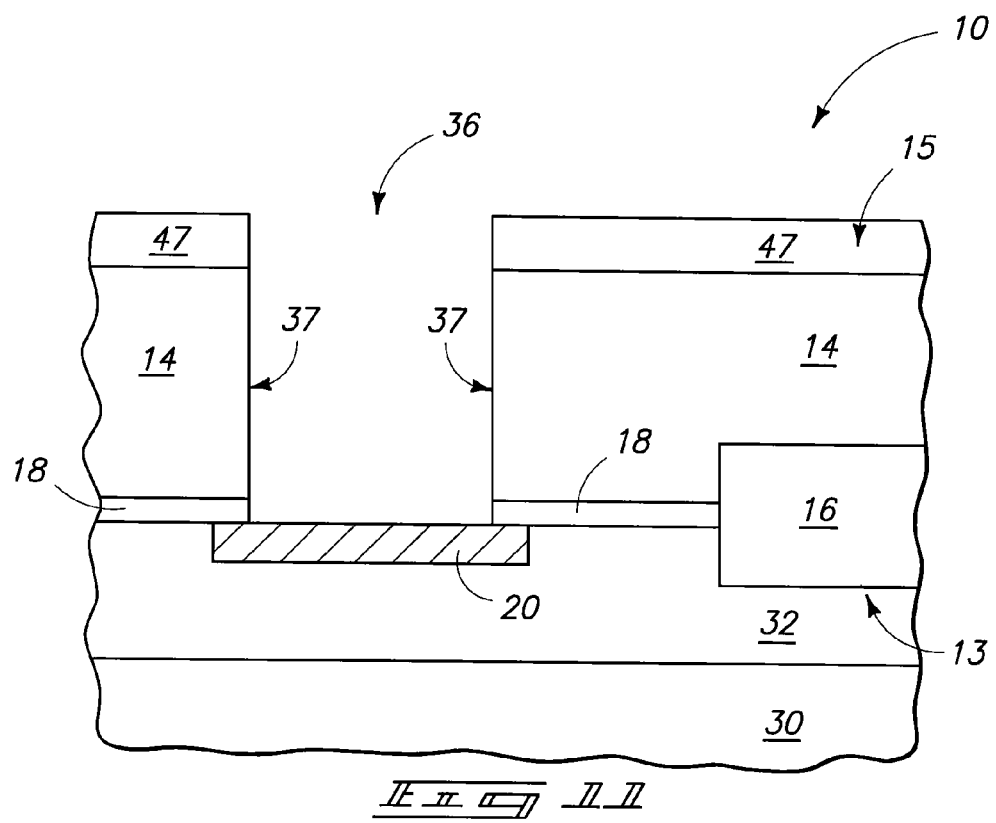
FIG. 11 is a view of the portion of FIG. 10 shown at a processing stage subsequent to that of FIG. 10.

Referring to FIG. 11, construction 10 is subjected to an etch of the type discussed above with reference to FIG. 3. Such etch punches through dielectric 18 while simultaneously reducing the sharpness of projections 39 (FIG. 10). In the shown embodiment, the etch has eliminated the projections and transformed the sidewalls 37 of FIG. 10 into straight sidewalls. The etch may also remove, or at least substantially reduce, any topographical roughness of sidewalls 37 due to scalloping resulting from the dry etch.

Another embodiment of forming a through wafer interconnect is discussed with reference to FIGS. 12 and 13. Similar numbering will be utilized for describing FIGS. 12 and 13 as is utilized above for describing FIGS. 1-4, where appropriate.

Figure 12:
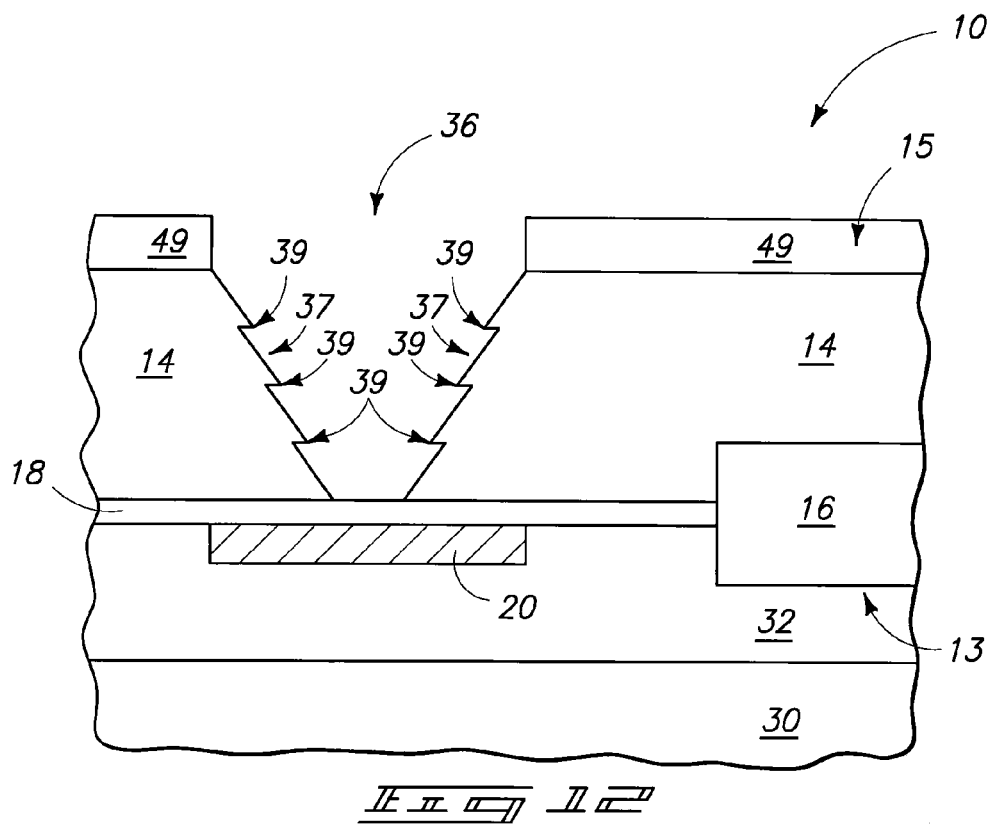
FIG. 12 is a diagrammatic, cross-sectional view of a portion of a semiconductor construction at a processing stage of another embodiment.

Referring to FIG. 12, construction 10 is illustrated at a processing stage subsequent to that of FIG. 1. A patterned masking material 49 is over base 14. Material 49 may comprise, for example, photolithographically-patterned photoresist. A plurality of sequential wet etches have been conducted to form opening 36. The wet etches form increasing narrow regions of the opening, and form projections 39 at interfaces where a portion of the opening formed by one wet etch ends and a portion formed by another wet etch begins.

Figure 13:
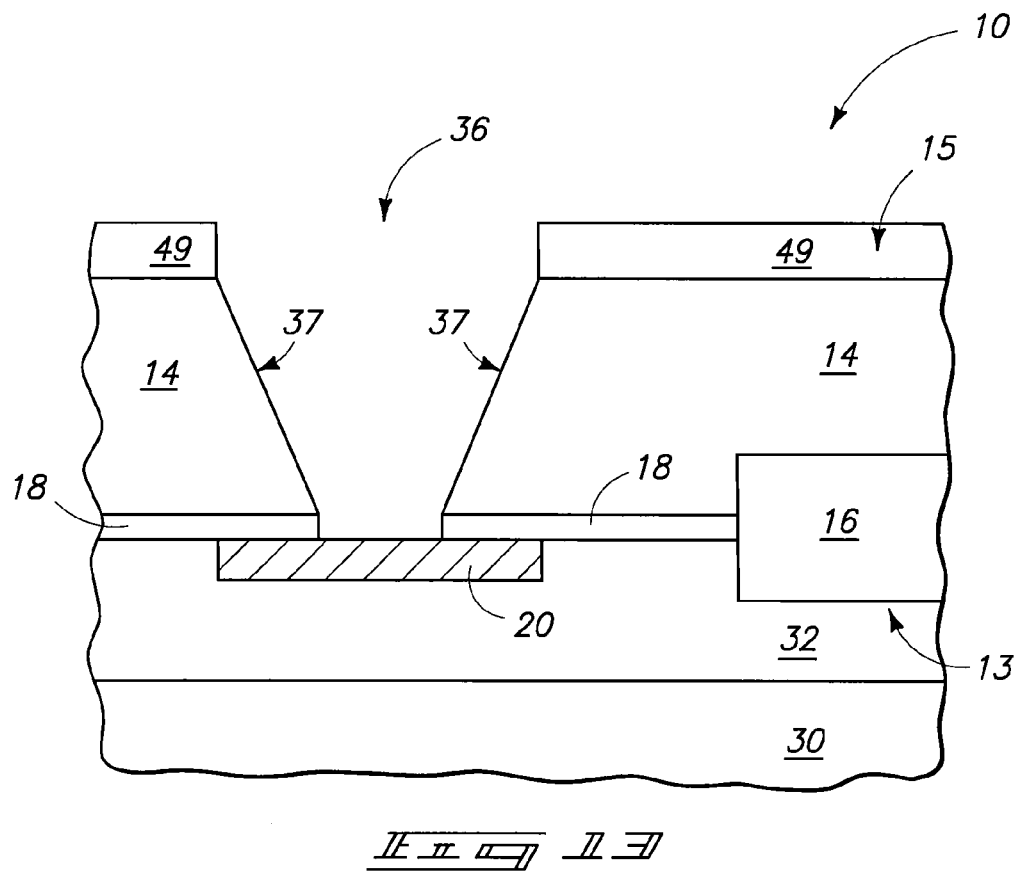
FIG. 13 is a view of the portion of FIG. 12 shown at a processing stage subsequent to that of FIG. 12.

Referring to FIG. 13, construction 10 is subjected to an etch of the type discussed above with reference to FIG. 3. Such etch punches through dielectric 18 while simultaneously reducing the sharpness of projections 39 (FIG. 12). In the shown embodiment, the etch has eliminated the projections and transformed the sidewalls 37 of FIG. 12 into straight sidewalls.

Figure 14:
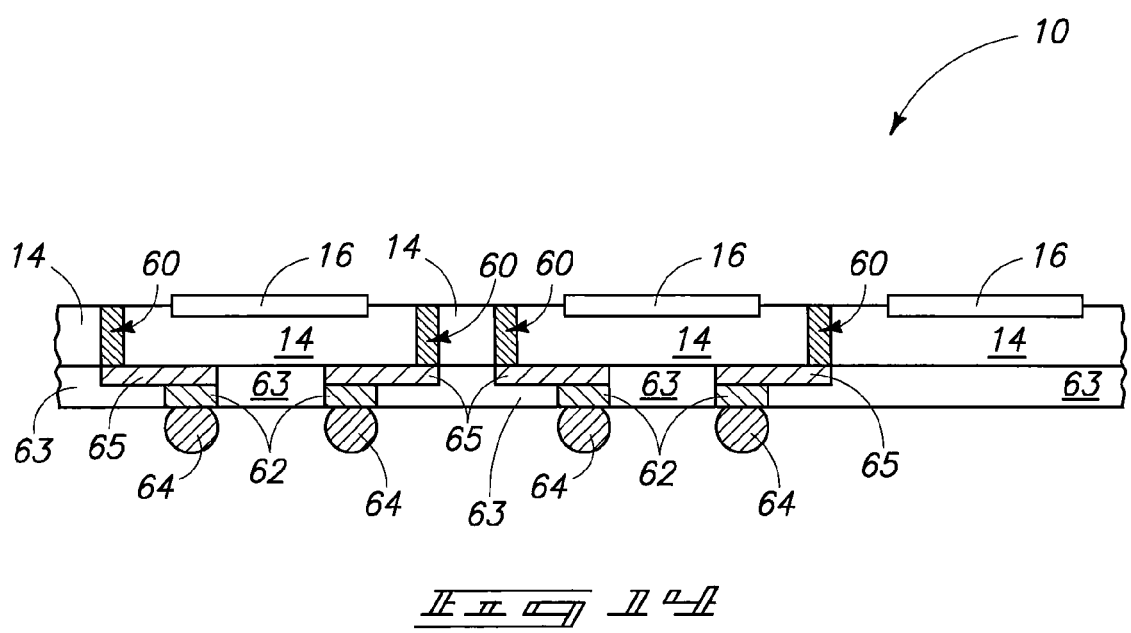
FIG. 14 is a diagrammatic, cross-sectional view of a portion of a semiconductor construction at a processing stage subsequent to that of FIG. 4.

Once the through-wafer interconnects are formed, solder balls or other connectors may be formed in electrical connection with conductive layer 20 so that construction 10 may be incorporated into a semiconductor package. FIG. 14 diagrammatically illustrates a portion of construction 10 at a processing stage subsequent to that of FIG. 4. The portion shown in FIG. 14 is shown upside down relative to the portion of FIG.

4, and comprises a more extended segment of construction 10 than does the portion of FIG. 4. In referring to FIG. 14, similar numbering will be used as is utilized above in describing FIG. 4, where appropriate.

The construction of FIG. 14 comprises the base 14 supporting a plurality of sensor arrays 16. The adhesive 32 (FIG. 4) and carrier wafer 30 (FIG. 4) have been removed.

Numerous through-wafer interconnects 60 extend through base 14 to connect with redistribution layers 65. The through-wafer interconnects may comprise conductive materials 52, 53 and 54 of FIG. 4, but such conductive materials are not specifically illustrated in FIG. 14 in order to simplify the drawing. Also, passivation 22 may remain over at least some regions of the backside of the wafer, and conductive material 20 may remain over some regions of the front side of the wafer, but such is not shown in order to simplify the drawing.

The redistribution layer 65 is shown subdivided into a plurality of segments. The segments may be electrically isolated from one another, or at least some of the segments may electrically couple with one another at regions outside of the plane of the cross-section of FIG. 14.

The redistribution layer 65 is shown coupled through bond pad regions 62 to solder balls 64. The bond pad regions may comprise conventional structures, and accordingly may comprise one or more of nickel, palladium, copper, gold, etc. The solder balls are one type of interconnect that may be formed over the bond pad regions, and other types of interconnects may be used in other embodiments. An example of another type of interconnect is a gold-to-gold connection. The bond pad regions are within an insulative material 63. Such material may comprise any suitable composition or combination of compositions, and may, for example, comprise one or more of silicon dioxide, organic polymeric material, silicon nitride, etc.

The conductive interconnects 60 will connect with integrated circuitry (not shown in FIG. 14) coupled with sensor arrays 16 so that the interconnects may be utilized to transfer electrical signals between the sensor arrays and the solder balls 64. The solder balls 64 may be ultimately connected to circuitry external of chip 10 so that data from sensors 16 may be passed to such external circuitry. For instance, chip 10 may be incorporated into a digital camera as the light sensor utilized in recording a digital image. The camera may be a stand-alone camera, or may be incorporated into a different device, such as, for example, a cell phone.

The etch discussed above with reference to FIGS. 3, 9, 11 and 13 may have other applications in addition to the specifically-described applications of removing sharp projections during fabrication of through-wafer openings. For instance, FIGS. 15-17 illustrate an application in which the etch may be utilized to remove corners from semiconductor material spacers, and in which the spacers are then utilized to support a macrolens over a sensor array.

Figure 15:
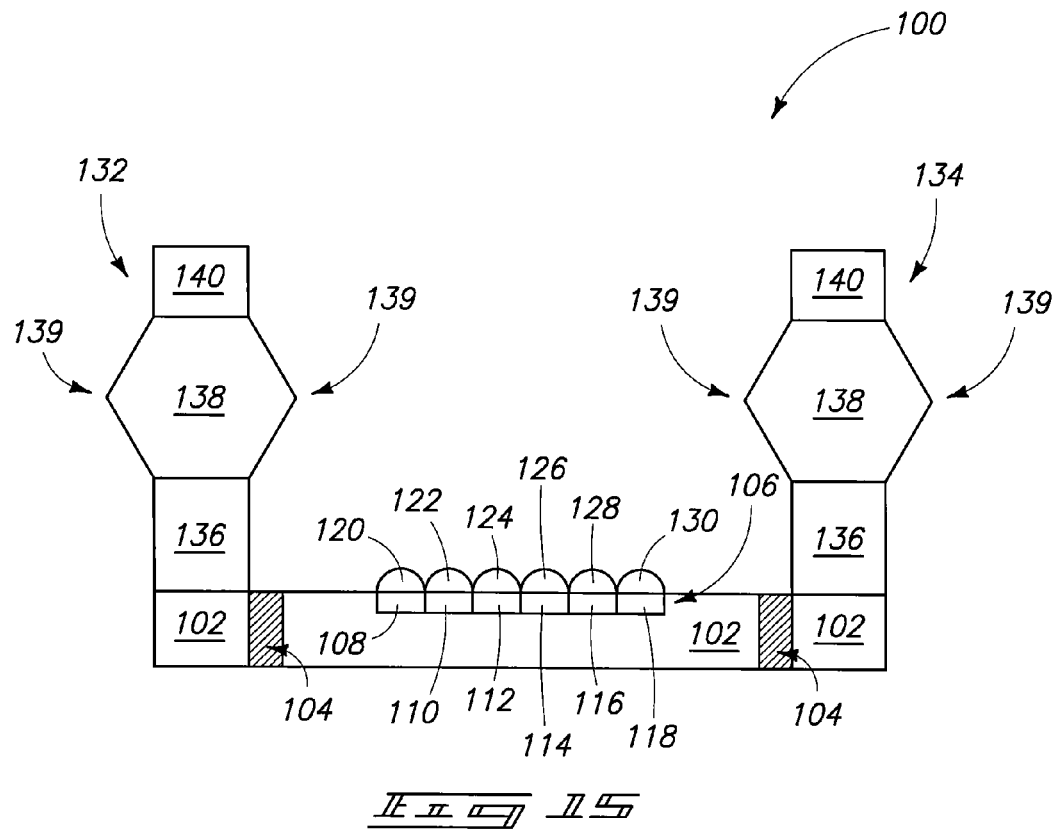
FIG. 15 is a diagrammatic, cross-sectional view of a portion of a semiconductor construction at a processing stage of another embodiment.
Figure 16:
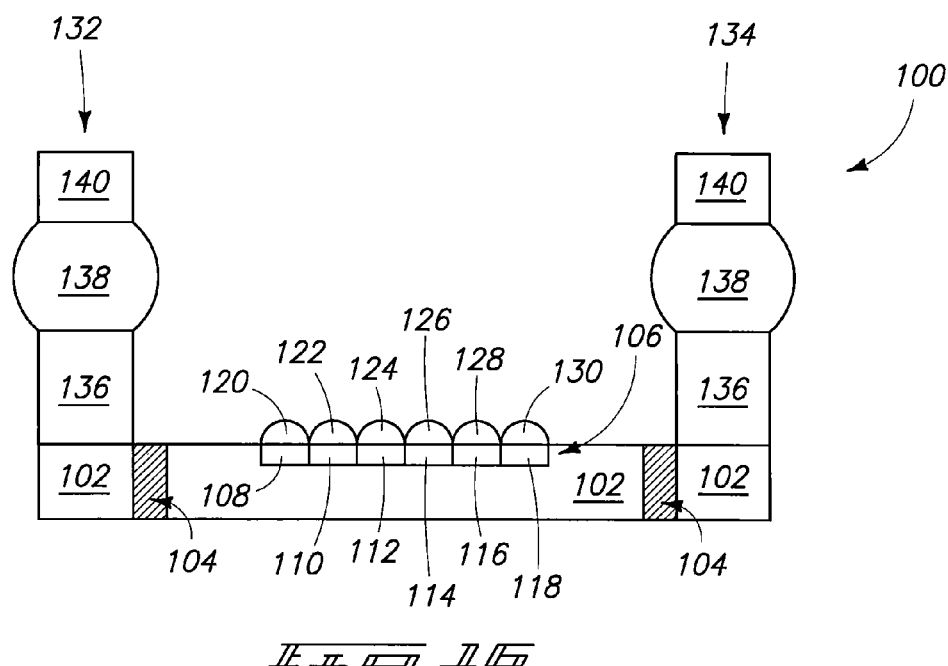
FIG. 16 is a view of the portion of FIG. 15 shown at a processing stage subsequent to that of FIG. 15.

Referring to FIG. 15, a portion of a semiconductor construction 100 is illustrated. The construction 100 comprises a base 102 having through-wafer interconnects 104 extending therethrough. The base may comprise the same composition as discussed above for base 14, and the through-wafer interconnects may be identical to the interconnects discussed above with reference to FIG. 4.

The base 102 supports a sensor array 106 which is diagrammatically illustrated to comprise individual sensors 108, 110, 112, 114, 116 and 118. The individual sensors may be conventional CMOS sensors. The sensor array 106 may be identical to the sensor arrays 16 discussed above with reference to FIGS. 1-13.

A plurality of microlenses 120, 122, 124, 126, 128 and 130 are formed over sensors 108, 110, 112, 114, 116 and 118, respectively. The microlenses may comprise conventional materials and constructions, such as, for example, any of those discussed in U.S. Pat. Nos. 6,307,243; 6,916,680; and 7,139,028. Accordingly, the microlenses may comprise any of various organic compositions; and may, for example, comprise, consist essentially of, or consist of one or more of polyimide, thermoplastic, thermoset resin, photosensitive gelatin and radiation-curable resin. The microlenses may be together referred to as a microlenses system formed over the sensor array 106.

A pair of structural supports 132 and 134 are formed over base 102 proximate the sensor array 106. The individual supports each comprise a lower region 136, a middle region 138, and a top region 140; and may be conventional structures.

The lower region is a material which may be bonded to base 102 and middle region 138, and may, for example, comprise, consist essentially of, or consist of a polymeric adhesive, such as, for example, an epoxy that can be thermally-cured and/or cured with ultraviolet radiation.

The middle region 138 is a spacer and may, for example, comprise, consist essentially of, or consist of monocrystalline silicon. The monocrystalline silicon is cut along crystalline planes, and comprises sharp corners 139. The spacers may be formed in the shown shape by cutting halfway into a semiconductor material to partially form the spacers, then flipping the semiconductor material and cutting halfway from the second exposed side to form a remaining portion of the spacers.

The top region 140 comprises a material which may be bonded to middle region 138, and also to a macrolens system, and may, for example, comprise, consist essentially of or consist of a polymeric adhesive, such as, for example, an epoxy that can be thermally-cured and/or cured with ultraviolet radiation.

The sharp corners 139 may be problematic in that they may cause cracking of materials deposit across such corners, and/or may block electromagnetic radiation from reaching some portions of sensor array 106 (in other words, may create shadows on the sensor array).

Referring to FIG. 16, construction 100 is illustrated after being subjected to the etch discussed above with reference to FIG. 3. Such etch removes portions of middle region 138 to round the corners 139 (FIG. 15). In some embodiments, the rounding of the corners may remove, for example, at least about one-third of the material of the corners. The etch selectively removes the portions of monocrystalline silicon 138 relative to exposed organic material of microlenses 120, 122, 124, 126, 128 and 130, and thus does not detrimentally affect the microlenses.

Referring to FIG. 17, a macrolens structure 150 is formed across pedestals 132 and 134, and over the microlenses 120, 122, 124, 126, 128 and 130. The macrolens structure may comprise any composition or combination of compositions suitable for focusing electromagnetic radiation on the microlenses, and may, for example, comprise, consist essentially of, or consist of polymer or composite material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor processing method, comprising:
   providing a composite patterned masking material over a first material, the patterned masking material having a patterned gap;
   utilizing the gap, forming an opening to extend through the first material and to a second material, the opening having scalloping along the first material, the scalloping forming substantially pointed features along the periphery of the opening; and
   performing an etch selective for the first and second materials relative to a patterned masking material; the etch dulling the substantially pointed features during the etch.

2. The method of claim 1 wherein:
   the patterned masking material comprises an organic material;
   the first material comprises monocrystalline silicon; and
   the second material comprises silicon dioxide.

3. The method of claim 2 wherein the etch has a selectivity for the monocrystalline silicon relative to the organic material of at least about 5:1, and has a selectivity for the silicon dioxide relative to the organic material of at least about 10:1.

4. The method of claim 1 wherein the dulling of the substantially pointed features reduces a height of such features by at least about a factor of 2.

5. The method of claim 1 wherein the dulling of the substantially pointed features substantially eliminates the features.

6. A semiconductor processing method, comprising:
   forming a construction having microlenses over a plurality of electromagnetic radiation sensors, the microlenses comprising a first material comprising one or more of polyimide, thermoplastic, thermoset resin, photosensitive gelatin and radiation-curable resin;
   forming spacers comprising spacer material over the construction, at least one of the spacers having at least one sharp corner;
   utilizing an etch selective for the material of the spacers relative to the first material to reduce the sharpness of the at least one corner; and
   forming a macrolens structure supported by the semiconductor spacers.

7. The method of claim 6 wherein the material of the spacers comprises monocrystalline silicon.

8. The method of claim 6 wherein the spacers comprise semiconductor material and wherein the first material comprises an organic composition.

9. The method of claim 6 wherein the etch comprises at least one fluorine-containing composition.

10. The method of claim 9 wherein the at least one fluorine-containing composition comprises all of $CF_4$, $CHF_3$, and $NF_3$.

11. The method of claim 6 wherein the reduction in sharpness of the at least one corner comprises rounding of the corner.

12. The method of claim 6 wherein the reduction in sharpness of the at least one corner removes at least about one-third of the material of the corner.

13. A semiconductor processing method, comprising:
   forming a semiconductor construction to comprise a dielectric material along a front side of a semiconductor wafer, to comprise a sensor array along the front side, and to comprise a conductive layer over a segment of the dielectric material; the semiconductor wafer having a back side in opposing relation to the front side, and having a through-wafer connection location defined therein; the dielectric material being formed to have a portion extending across the through-wafer connection location, and the conductive layer being formed to have a portion extending across the through-wafer connection location; the sensor array being laterally offset from said portions of the dielectric material and conductive layer;
   forming a patterned masking material over the back side of the semiconductor wafer, the patterned masking material having a gap extending therethrough to the through-wafer connection location;
   etching the semiconductor wafer through the gap to form a through-wafer opening extending to the dielectric material, the through-wafer opening having scalloping along a sidewall periphery, the scalloping forming substantially pointed features along the sidewall periphery; and
   extending the opening through the dielectric material and to the conductive material with an etch selective for the semiconductor wafer and dielectric material relative to the masking material; the etch dulling the substantially pointed features during the extending of the opening into the dielectric material.

14. The method of claim 13 further comprising forming an electrically insulative spacer along the sidewall periphery after the dulling, the spacer narrowing the opening.

15. The method of claim 14 further comprising forming conductive material within the narrowed opening; the conductive material comprising at least a portion of an interconnect that extends from the back side of the wafer to the conductive layer on the front side of the wafer.

16. The method of claim 13 wherein the etch utilizes at least one fluorine-containing composition selected from the group consisting of $CF_4$, $CHF_3$, and $NF_3$.

17. The method of claim 13 wherein:
   the patterned masking material comprises an organic material;
   the substantially pointed features comprise monocrystalline silicon; and
   the dielectric material comprises silicon dioxide.

18. The method of claim 13 wherein the sensor array is a CMOS sensor array.

19. The method of claim 13 wherein the dulling of the substantially pointed features reduces a height of such features by at least about a factor of 2.

20. The method of claim 13 wherein the dulling of the substantially pointed features substantially eliminates the features.

* * * * *